US008618888B2

(12) United States Patent
Kim

(10) Patent No.: US 8,618,888 B2
(45) Date of Patent: Dec. 31, 2013

(54) VOLTAGE CONTROLLED OSCILLATOR HAVING A BANDWIDTH ADJUSTED AMPLITUDE CONTROL LOOP

(75) Inventor: Heung S. Kim, San Jose, CA (US)

(73) Assignee: LSI Corporation, San Jose, CA (US)

( * ) Notice: Subject to any disclaimer, the term of this patent is extended or adjusted under 35 U.S.C. 154(b) by 115 days.

(21) Appl. No.: 12/502,377

(22) Filed: Jul. 14, 2009

(65) Prior Publication Data

US 2009/0273407 A1 Nov. 5, 2009

Related U.S. Application Data

(60) Division of application No. 11/830,003, filed on Jul. 30, 2007, now Pat. No. 7,567,140, and a continuation-in-part of application No. 11/256,696, filed on Oct. 24, 2005, now Pat. No. 7,271,676.

(60) Provisional application No. 60/825,256, filed on Sep. 11, 2006.

(51) Int. Cl.
*H03K 3/03* (2006.01)
(52) U.S. Cl.
USPC .............................. 331/57; 331/182; 331/183
(58) Field of Classification Search
USPC ............................................ 331/57, 182, 183
See application file for complete search history.

(56) References Cited

U.S. PATENT DOCUMENTS

| 4,603,288 | A | | 7/1986 | Rogers | 323/234 |
|---|---|---|---|---|---|
| 5,412,349 | A | * | 5/1995 | Young et al. | 331/34 |
| 5,705,947 | A | * | 1/1998 | Jeong | 327/270 |
| 5,748,048 | A | * | 5/1998 | Moyal | 331/34 |
| 5,821,821 | A | | 10/1998 | Ahdab et al. | 331/57 |
| 5,847,616 | A | * | 12/1998 | Ng et al. | 331/57 |
| 5,955,929 | A | * | 9/1999 | Moon et al. | 331/57 |
| 6,614,318 | B1 | | 9/2003 | Boecker | 331/17 |
| 6,653,908 | B1 | | 11/2003 | Jones | 331/183 |
| 6,838,952 | B2 | | 1/2005 | Ramet | 331/183 |
| 6,909,336 | B1 | | 6/2005 | Rajagopalan et al. | 331/183 |
| 7,026,883 | B2 | * | 4/2006 | Muthali et al. | 331/183 |
| 7,106,109 | B2 | * | 9/2006 | Wu | 327/101 |
| 7,154,331 | B2 | * | 12/2006 | Zaguri | 330/254 |
| 7,196,592 | B2 | | 3/2007 | Shi et al. | 331/117 FE |
| 7,271,676 | B2 | | 9/2007 | Kim | 331/183 |
| 7,420,410 | B2 | * | 9/2008 | Ohba | 330/9 |
| 7,449,972 | B2 | | 11/2008 | Juang et al. | 331/182 |
| 2003/0025566 | A1 | | 2/2003 | Rogers | 331/109 |

OTHER PUBLICATIONS

Ian A. Young, et al., "A PLL Clock Generator with 5 to 110 MHz of Lock Range for Microprocesors", IEEE Journal of Solid-State Circuits, vol. 27, No. 11, Nov. 1992, pp. 1599-1607.

(Continued)

*Primary Examiner* — Arnold Kinkead
*Assistant Examiner* — Richard Tan
(74) *Attorney, Agent, or Firm* — Christopher P. Maiorana, PC

(57) ABSTRACT

An apparatus comprising a first circuit and a second circuit. The first circuit may be configured to generate an output signal oscillating at a frequency in response to a first control signal and a second control signal. The second circuit may be configured to generate the second control signal in response to (i) an input voltage and (ii) the output signal. The second circuit (i) generates the second control signal by comparing a peak voltage of the output signal to the input voltage and (ii) adjusts an amplitude of the control signal in response to the comparison.

12 Claims, 6 Drawing Sheets

(56) References Cited

OTHER PUBLICATIONS

Mihai A. Margarit et al., "A Low-Noise, Low-Power VCO with Automatic Amplitude Control for Wireless Applications", IEEE Journal of Solid-State Circuits, vol. 34, No. 6, Jun. 1999, pp. 761-771.

John G. Maneatis, "Low-Jitter Process-Independent DLL and PLL Based on Self-Biased Techniques", IEEE Journal of Solid-State Circuits, vol. 31, No. 11, Nov. 1996, pp. 1723-1732.

John G. Maneatis et al., "Precise Delay Generation Using Coupled Oscillators", IEEE Journal of Solid-State Circuits, vol. 28, No. 12, Dec. 1993, pp. 1273-1282.

* cited by examiner

VOLTAGE CONTROLLED OSCILLATOR HAVING A BANDWIDTH ADJUSTED AMPLITUDE CONTROL LOOP

This is a divisional of U.S. Ser. No. 11/830,003, filed Jul. 30, 2007, now U.S. Pat. No. 7,567,140, which is incorporated by reference.

RELATED APPLICATION DATA

This application claims the benefit of U.S. Provisional Application No. 60/825,256, filed Sep. 11, 2006 and is hereby incorporated by reference in its entirety.

This application is also a Continuation-In-Part of application Ser. No. 11/256,696, filed Oct. 24, 2005, now U.S. Pat. No. 7,271,676 which is hereby incorporated by reference in its entirety.

FIELD OF THE INVENTION

The present invention relates to oscillators generally and, more particularly, to an apparatus and/or method for implementing a voltage controlled oscillator having a bandwidth adjusted amplitude control loop.

BACKGROUND OF THE INVENTION

In a typical optical media Read/Write channel Integrated Circuit, a wide range of clock frequencies are often needed to accommodate different data rates and different optical storage media. Even when using a single media, a multiple speed operation often needs to be supported. The channel bit data rates of a 1×DVD, a 1×CD and a 1× blu-ray disc (BD) are 26.16 Mbps, 4.32 Mbps and 66 Mbps, respectively. A DVD R/W channel can operate at speeds ranging from 1~16×. A 16×DVD operation has a transfer rate of up to 418.56 Mbps. A CD R/W channel operates at speeds from 1~52×. A 56×CD operation can reach a transfer rate of up to 224.64 Mbps. A wide frequency range in clock generation is necessary to support such a wide range of bit rates.

In conventional approaches, in order to cover a wide frequency range, a Voltage Controlled Oscillator (VCO) using a single large Kvco (i.e., a gain value of the VCO) has been implemented. For example, see (I. A. Young, J. K. Greason, K. L. Wong, "A PLL Clock Generator with 5 to 110 Mhz of Lock Range for Microprocessors," IEEE J. Solid-State Circuits, pp. 1599-1607, November 1992. Also see John G. Maneatis, "Low-Jitter Process-Independent DLL and PLL Based on Self-Biased Techniques," IEEE J. Solid-State Circuits, pp. 1723-1732, November 1996.). However, a large Kvco causes more sensitivity to noise on the output node of the charge pump. Also, it is practically impossible to keep a certain constant ratio $\omega_n/\omega_c$ for all frequencies using conventional approaches. It is important to meet the timing loop bandwidth $\omega_n$ to an oscillator frequency $\omega_c$ relationship for a data acquisition and tracking for DVD read channel system. Using such conventional techniques, in order to achieve a wide oscillation frequency range, the amplitude control loop (ACL) loop bandwidth variation caused by a VCR (Voltage Controlled Resistor) stage needs to be compensated.

In certain system designs, if the ICO oscillation frequency becomes higher, a fast response at the ICO is also needed. In such a system, the ACL loop bandwidth needs to be increased as the oscillation frequency goes higher. Another problem with conventional approaches occurs. When the oscillation frequency becomes slow, a control current then becomes lower. This increases the gain of the VCR, so the bandwidth of the ACL becomes larger. This frequency becomes a $2^{nd}$ pole of the PLL. As the bandwidth of the amplitude control loop increases and approaches the bandwidth of the PLL, the oscillator becomes unstable.

Due to weak gain characteristics of a conventional MOS transistor, it is not practical, or even possible, to maintain a fixed ring oscillator swing voltage for a wide frequency range with the diode characteristics of a MOS transistor. For a wide frequency oscillation range, the ACL (amplitude controlled loop) is adopted to keep a targeted amplitude swing voltage in an oscillator.

It would be desirable to implement an oscillation design that resolves the problem with opposite direction amplitude control loop bandwidth in an oscillator.

SUMMARY OF THE INVENTION

The present invention concerns an apparatus comprising a first circuit and a second circuit. The first circuit may be configured to generate an output signal oscillating at a frequency in response to a first control signal and a second control signal. The second circuit may be configured to generate the second control signal in response to (i) an input voltage and (ii) the output signal. The second circuit (i) generates the second control signal by comparing a peak voltage of the output signal to the input voltage and (ii) adjusts an amplitude of the control signal in response to the comparison.

The objects, features and advantages of the present invention include providing a voltage controlled oscillator that may (i) implement a bandwidth adjusted control loop, (ii) have a wide range PLL bandwidth, (iii) have a wide range oscillation frequency range, and/or (iv) extend the application field of a replica VCO circuitry.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
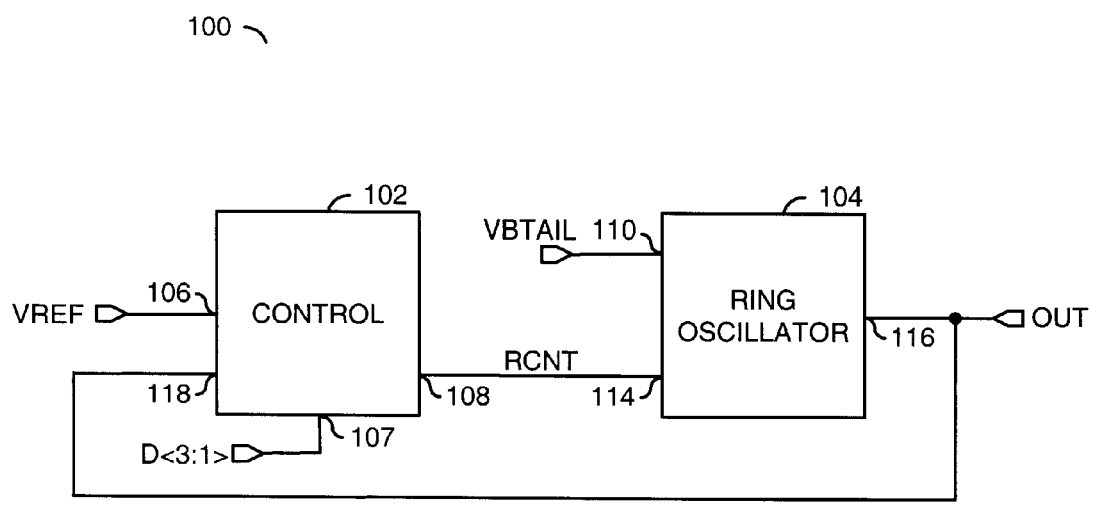
FIG. 1 is a block diagram of a preferred embodiment of the present invention.

Referring to FIG. 1, a block diagram of a system 100 is shown in accordance with a preferred embodiment of the present invention. The system 100 may be implemented as an oscillator. In one example, the system 100 may be implemented as a voltage controlled oscillator (VCO) having a bandwidth adjusted amplitude control loop. The system 100 generally comprises a first circuit 102 and a second circuit 104. The first circuit 102 may be implemented as a control circuit. In one example, the circuit 102 may be implemented as a peak amplitude control circuit (to be described in more detail in connection with FIG. 2). In another example, the circuit 102 may be implemented as a replica biasing control circuit (to be described in more detail in connection with FIG. 3). The present invention may be implemented in a variety of applications. For example, the system 100 may be suitable for CD, DVD, or Blu-Ray optical discs.

The circuit 104 may be implemented as a ring oscillator circuit. The circuit 102 may have an input 106 that may receive a signal (e.g., VREF), an input 107 that may receive a signal (e.g., D<3:1>), and an output 108 that may present a signal (e.g., RCNT). The signal RCNT may be a resistor control signal. The signal VREF may be a reference voltage signal. The signal VREF may be generated by a reference voltage generation circuit (not shown).

The signal D<3:1> may be a digital control input signal. The signal D<3:1> may be stored in a register bank (not shown). In one example, the signal D<3:1> may be generated by software external (or internal) to the system 100. In one example, the signal D<3:1> may be a multi-bit signal. The particular number of bits may be varied to meet the design criteria of a particular implementation. The circuit 104 may have an input 110 that may receive a signal (e.g., VBTAIL), an input 114 that may receive the signal RCNT and an output 116 that may present a signal (e.g., OUT). The signal OUT may also be presented to an input 118 of the circuit 102 as a signal IN. The signal OUT may be an output signal that may oscillate at a particular frequency. In one example, the signal IN may be a differential input signal. However, a single ended signal may be implemented in certain applications. In one example, the signal OUT may be a differential output signal. However, a single ended signal may be implemented in certain applications.

Figure 2:
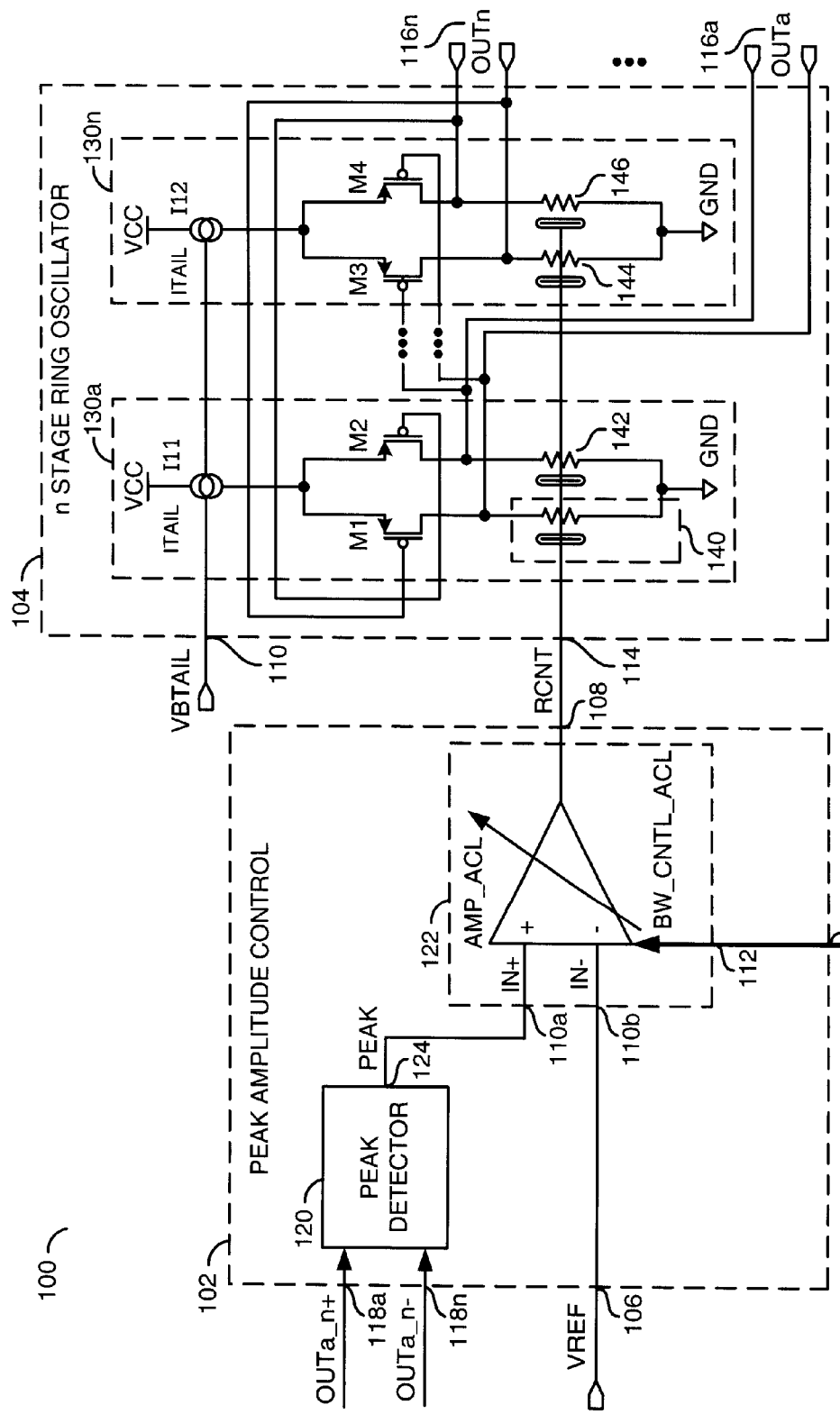
FIG. 2 is a circuit diagram illustrating a VCO using a bandwidth controlled peak detection amplitude control loop.

Referring to FIG. 2, a more detailed diagram of the circuit 100 is shown. The circuit 102 generally comprises a circuit 120, and a circuit 122. The circuit 120 may be implemented as a peak detection circuit. Details of the peak detection circuit 120 may be found in copending application Ser. No. 11/256, 696. The circuit 122 may be implemented as an amplifier circuit. In one example, the circuit 122 may be implemented as an adjustable gain comparison circuit. The circuit 102 shows a number of inputs 118a-118n configured to receive a feedback of the output signals OUTa-OUTn. The circuit 120 may generate a signal (e.g., PEAK) that may be presented to a positive input 110a of the circuit 122. The signal PEAK may represent the highest magnitude signal of the output signals OUTa-OUTn. The circuit 122 may be implemented as an operational amplifier or other type of comparison circuit. The circuit 122 may have a negative input that may receive the signal VREF. The circuit 122 may also have an input 112 that may receive the signal D<3:1>. The signal D<3:1> may be used to adjust the gain of the circuit 122. The circuit 122 may generate the signal RCNT.

The circuit 104 generally comprises a number of stages 130a-130n. Each of the stages 130a-130n may be implemented as a delay cell. Each of the stages 130a-130n may receive an input signal from the output of the previous stage. Each of the stages 130a-130n may present a respective one of the output signals OUTa-OUTn. In particular, the stage 130a may present an output signal OUTa, while the stage 130n may present the output signal OUTn. Each of the output signals OUTa-OUTn may be either single ended or differential. The particular number of stages 130a-130n may be varied to meet the design criteria of a particular implementation. The stage 130a generally comprises a current source I11, a transistor M1, a transistor M2, a voltage controlled resistor 140, and a voltage controlled resistor 142. The stage 130n generally comprises a current source I12, a transistor M3, a transistor M4, a voltage controlled resistor 144, and a voltage controlled resistor 146. The voltage controlled resistors 140, 142, 144 and 146 each receive the control signal RCNT. The current source I11 may be controlled by the signal VBTAIL. Each additional stage (e.g., 130a+1 through 130n−1) may be implemented with similar components and connections.

The peak amplitude control block 102 may be used to resolve swing amplitude variation issues as the frequency of oscillation of the signals OUTa-OUTn increases. Real swing amplitudes of each of the delay cells 130a-130n are normally detected and compared to the reference voltage signal VREF. The peak amplitude control circuit 102 may be used to detect the highest level of the output signals OUTa-OUTn. The peak amplitude control circuit 102 may control the signal amplitudes of the delay cells 130a-130n by changing a resistance value of the voltage controlled resistors 140, 142, 144 and 146 through adjustments to the signal RCNT. The amplifier 122, the voltage controlled resistors 140, 142, 144 and 146, and the peak detector may form an amplitude control loop (ACL).

In general, each of the outputs OUTa-OUTn are presented to the peak detection circuit 120. By processing each of the outputs OUTa-OUTn, potential ripple offset on the signal PEAK will be minimized. The number of peaks during a period of a particular frequency of oscillation will normally be 2 for a differential output, since the number of peaks normally equals the differential output n (e.g., the number of delay cell stages). For example, if a 4 stage differential ring oscillator is generating a 100 Mhz clock, the frequency of the peak point will be 800 Mhz. Because of the relatively high peak detection frequency, the voltage held on the signal PEAK will be updated more frequently.

The ring oscillator 104 is shown implemented with PMOS transistors M1, M2, M3 and M4. However, the ring oscillator 104 may be implemented with other types of transistors. For example, the transistors M1, M2, M3 and M4 may be implemented with NMOS transistors. In such an implementation, the voltage control resistors 140, 142, 144 and 146 may be tied to the supply voltage VCC. In such an implementation, the peak detection circuit 120 may detect the lowest voltage to sense the swing amplitude from the supply voltage VCC to the lowest voltage. In another implementation, the transistors M1-M4 may also be implemented as PMOS transistors. The current source I11, and the current source I12 may be tied to the supply voltage VCC. In general, the particular polarities of the various transistors and the various signals may be adjusted (e.g., reversed or inverted) to meet the design criteria of a particular implementation.

The present invention may be used to implement a linearly proportional gain Kvco over a wide frequency range. In the circuit 100, all of the outputs of the current controlled delay cells 130a-130n are normally presented to the peak detection circuit 120. The delay cells 130a-130n have a source coupled multiple pairs, a current source (e.g., I11) with a charge storing capacitor, and an error amplifier 122 that generates the VCR bias to control the targeted swing amplitude value. The amplitude of the delay cell outputs 116a-116n may be maintained even when a parasitic capacitance and a linear proportional Kvco are achieved. For a wide frequency current controlled oscillator (ICO), a wide range of values for the current Itail may be implemented in each ring oscillator delay cell 130a-130n.

Figure 3:
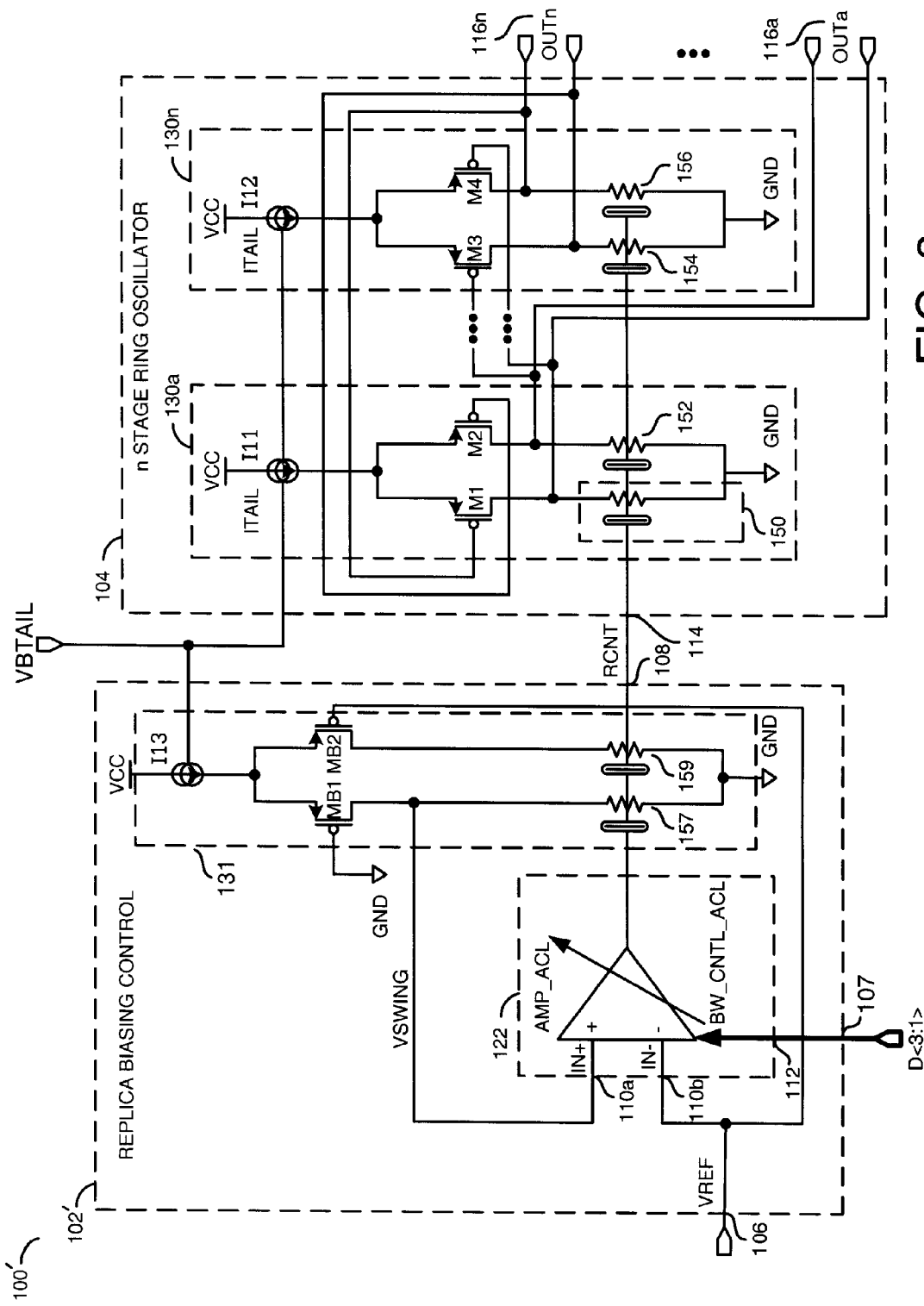
FIG. 3 is a circuit diagram illustrating a VCO using a bandwidth controlled replica biasing amplitude control loop.

Referring to FIG. 3, a circuit 100' is shown implementing an alternate embodiment of the present invention. The circuit 100' implements a circuit 102' in place of the circuit 102 of FIG. 2. The circuit 102' may be implemented as a replica biasing control circuit. The circuit 102' includes the bandwidth adjustable error amplifier 122. The circuit 100' may implement an amplitude control loop biasing VCR technique that may maintain a fixed value for a signal (e.g., VSWING) over a wide range of the current Itail. In the circuit 100', the linear range of the VCRs 150, 152, 154, and 156 may be enhanced by implementing non-doped VT transistors, along with traditional enhancements as shown.

The circuit 102' may include a replica cell 131. The replica cell generally comprises a transistor MB1, a transistor MB2, a current source 113, a voltage controlled resistor 157, and a voltage controlled resistor 159. The replica cell 131 may have a similar implementation as the delay cells 130a-130n. The signal VSWING is normally generated by the replica cell 131 and presented to the input 110a. In the system 100', the replica cell 131 forms a portion of the amplitude control loop.

The replica cell 131 may be referred to as a VCR biasing control loop. In the VCR biasing control loop, the bandwidth of the amplitude control loop (ACL) may be changed to the opposite direction of a PLL loop bandwidth, which is proportional to $\omega_c$. An ACL bandwidth change alone may cause a stability problem if the bandwidth of the ACL (which can play as the second pole in the PLL loop) comes close to a whole timing loop bandwidth ($\omega_n$). To compensate, an adjustable bandwidth ACL may be implemented. The circuit 100' may adjust a gain of the error amplifier 122 in front of the voltage controlled resistors 150, 152, 154, 156, 157 and 159.

In the DVD R/W channel chip, one Multi-Peak Amplitude Control Loop (MPACL) VCO and two charge pump digital to analog converters (DACs) are shared between a clock recovery in a read mode and a multi-phase clocks generation for a write strategy. In the clock recovery read mode, phase error is calculated by digitized channel data. The phase error may be delivered to two 4 bit DACs and in the write mode. The phase error is normally calculated from a digitized wobble input signal. The MPACL VCO may generate 8 phase clocks in 2× faster speed for 16 phases in a write strategy. The circuit 100' may save the number of stages 130a-130n needed to be implemented. The bus lines between a VCO and a write control block may also be reduced.

The frequency of oscillation of the ring oscillator 104 may be defined as:

$$Fvco=(alpha)*(I12)/(VSWING)*(C \text{ at the output of the delay cell (such as the cell 130a));}$$

where a current Itail is decided by the signal VBTAIL and the size of the transistor M4;

the signal VSWING is controlled by the amplitude control loop;

C is decided by the capacitances of the transistor M1 and the transistor M2 in the delay cell 130a and a capacitance of the VCR 140 (or an additional capacitor could be added);

alpha is a constant;

The signal VBTAIL controls the frequency of oscillation of the signals OUTa-OUTn.

Figure 4:
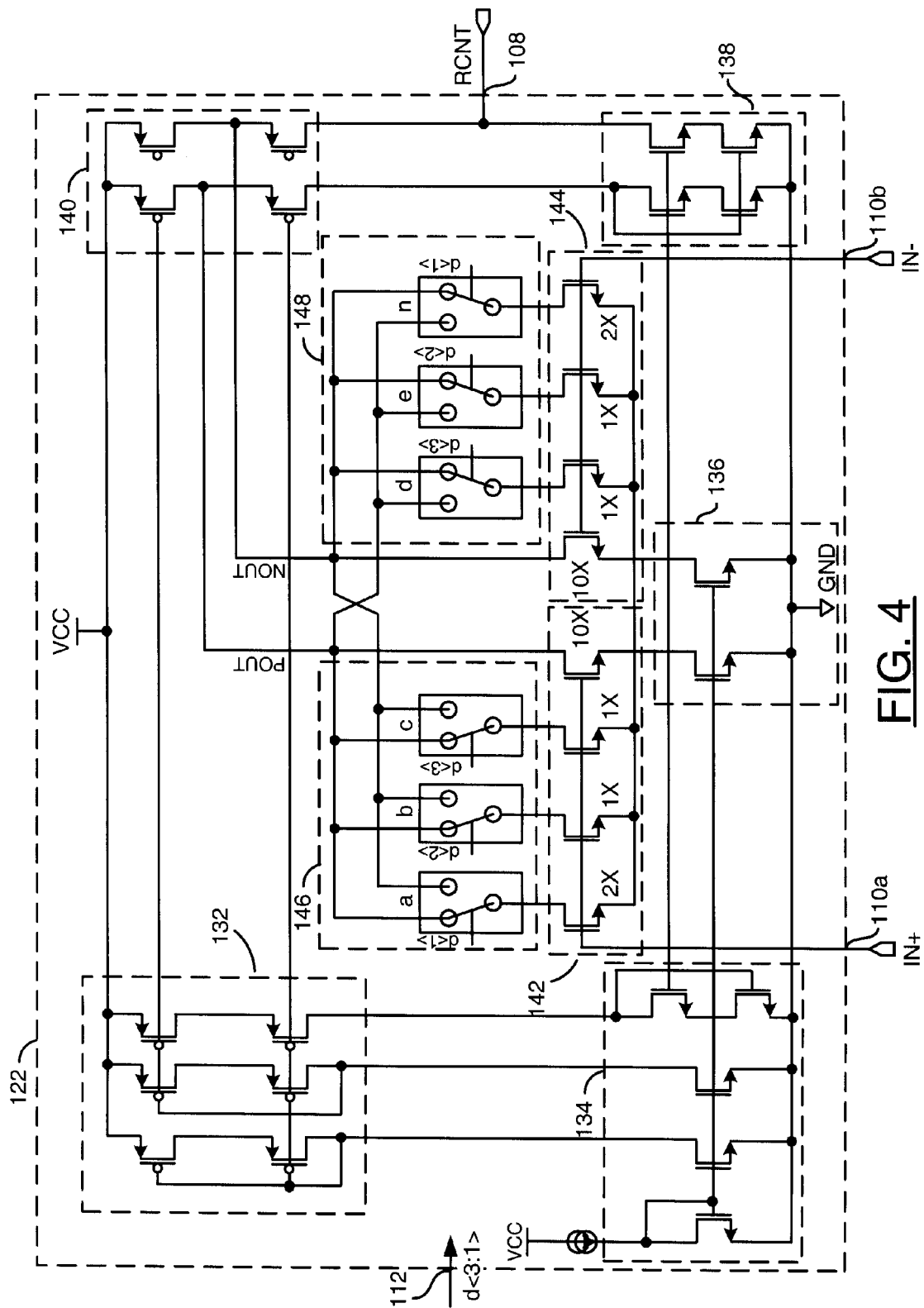
FIG. 4 is a circuit diagram illustrating a bandwidth control amplifier.

Referring to FIG. 4, a more detailed diagram of the circuit 122 is shown. The circuit 122 illustrates an implementation of a bandwidth adjustable error amplifier. The circuit 122 may be used in the circuit 100 or the circuit 100'. The circuit 122 generally comprises a number of transistors 132, a number of transistors 134, a number of transistors 136, a number of transistors 138, a number of transistors 140, a number of transistors 142, a number of transistors 144, a number of switches 146, and a number of switches 148. The switches 146 may be used to turn the transistors 142 ON or OFF in response to the signal D<3:1>. Similarly, the switches 148 may be used to turn the transistors 144 ON or OFF in response to the signal D<3:1>. The circuit 122 may implement a bandwidth adjustment by changing a load capacitance on the signal RCNT. In one example, this may be done by changing a compensation capacitance in the error amplifier.

By using the bandwidth control amplifier 122 for a higher ICO frequency having a high current Itail, the bandwidth of the amplifier 122 is normally increased by switching a number of the switches 146a-146n to a node (e.g., POUT). The more of the switches 146a-146n that are connected to the node POUT, the higher the frequency of oscillation. Similarly, for a low ICO frequency of oscillation which has a low current Itail, a number of the switches 146a-146n may be connected to an output node (e.g., NOUT). The more of the switches 146a-146n that are connected to the node NOUT, the lower the frequency of oscillation. In a differential operation, the output of a pair of the switches (e.g., the switch 146a and the switch 146d, 146b and 146e, and 146c and 146n) are normally connected to opposite nodes. For example, if the switch 146a is tied to POUT, then the switch 146d may be tied to the node NOUT. The bandwidth of the ACL may track the movement of the PLL frequency to enhance bandwidth and stability control of a PLL.

Figure 5:
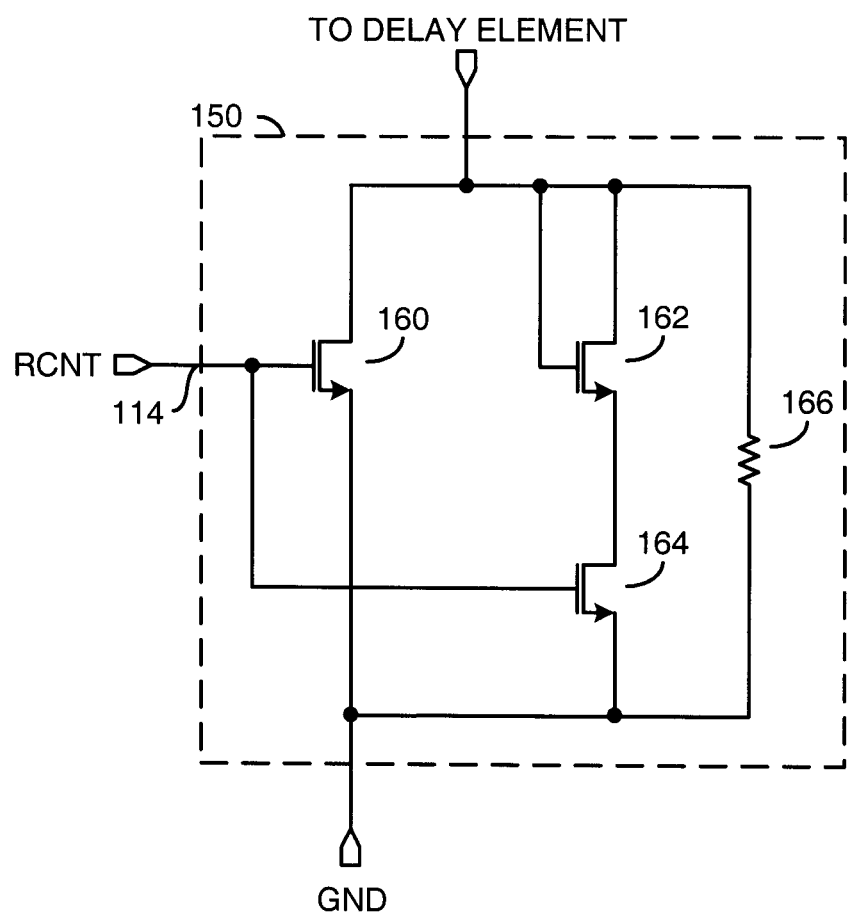
FIG. 5 is a circuit diagram illustrating an example of a voltage controlled resistor.

Referring to FIG. 5, an example implementation of the voltage controlled resistor 150 is shown. The voltage controlled resistor 150 generally comprises a transistor 160, a transistor 162, a transistor 164, and a resistor 166. In one example, the transistors 160, 162, and 164 may each be implemented as NMOS devices. However, a PMOS implementation may be used if needed to meet the design criteria of a particular implementation. The transistor 160 and the transistor 164 may each have a gate that may receive the signal RCNT. The sources of the transistors 160, 162, the resistor 166, and a gate of the transistor 162 may be connected to one of the delay elements 130a-130n.

Figure 6:
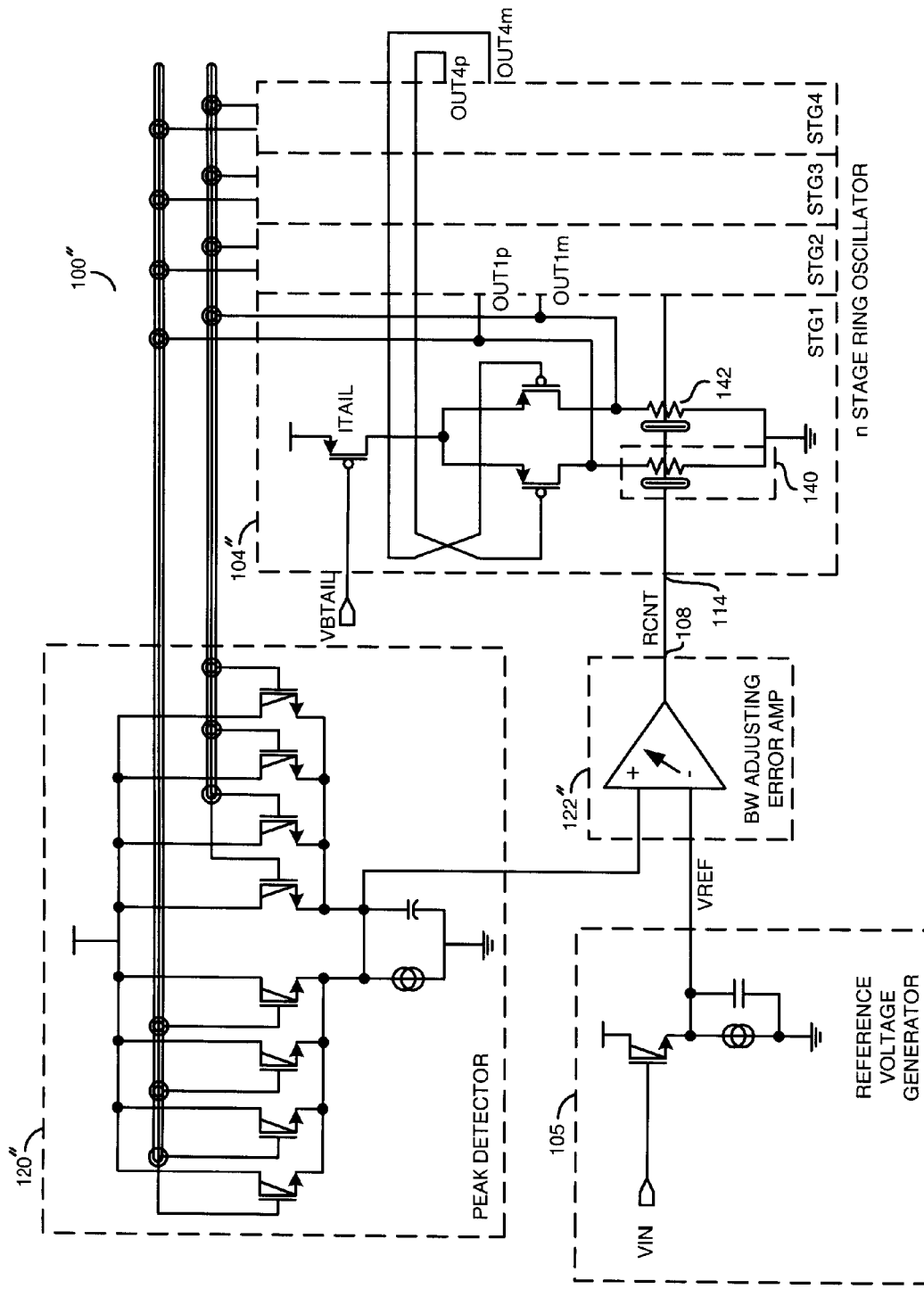
FIG. 6 is a circuit diagram illustrating a bandwidth adjusted amplitude control loop in a peak amplitude controlled current controlled oscillator.

Referring to FIG. 6, a diagram of a circuit 100" is shown implementing an alternate embodiment of the present invention. The circuit 100" implements a bandwidth adjusted amplitude control loop in a peak amplitude current controlled oscillator. The ACL may include an n-stage ICO 104", a peak detector 120", a reference voltage generator 105 and a bandwidth adjusting error amplifier 122". There may be two general functions in the bandwidth adjusted ACL of a peak amplitude ICO. The ICO 104" may comprise a number of stages (e.g., stg1, stg2, stg3, . . . , and stg-n). The ICO 104" may form a ring oscillator generating an oscillation frequency linearly proportional to the current Itail. Another function of the ACL may be to maintain a targeted swing amplitude of the ring oscillator 104" by a loop control for all ranges of the current Itail.

The need to adjust bandwidth becomes more serious if a PLL needs to cover wider frequency range and the bandwidth of the ACL becomes closer to the bandwidth of the overall PLL. The function of the ICO may be a current controlled ring oscillator. In a PLL, a voltage on a loop filter voltage may generate the current Itail. For a higher frequency oscillation, the loop filter voltage is increased, then a higher current Itail is generated by a transconductance gm cell. Then, the higher current Itail drives the ICO to oscillate at a higher frequency, in a relationship defined as:

$$Fosc=Itail/(2*n*C_{L*Vswing})$$

where,

Fosc; oscillation frequency in an ICO n*CL; load capacitance in the n stage delay cell output node Vswing; oscillation swing amplitude In order to increase oscillation frequency with a higher current Itail, the signal VSWING should be maintained to a certain fixed amplitude even if a large current Itail flows into the voltage controlled resistors.

In order to achieve a wide frequency range of operation, a wide range of current Itail values may be implemented. Also, the VCR needs to have an inverse wide resistance range to the variation of the current Itail in order to keep a constant relationship as:

(fixed constant swing)=(Itail*(resistance value of a VCR)).

The input of the VCR is normally controlled by the error amplifier 122, where the output range is limited by a rail to rail range of the supply voltage.

The function of the peak detector 120" may be to select and store a largest swing out of multiple outputs OUTa-OUTn. The peak detector 120" may receive all positive and negative outputs of the ring oscillator delay cells. The peak detector 120" may also receive partial sets of the outputs OUTa-OUTn of the ring oscillator 104". A peak detection function may even be implemented without using a positive output of the ring oscillator 104". The error amplifier 122" may compare a detected peak voltage on the peak detector with the reference voltage VREF. If the detected peak is larger than the reference voltage VREF, the output of the error amplifier 122 increases, reducing a resistance of the VCR. The swing amplitude is then reduced and becomes the same as the reference voltage VREF. In another example, if the detected peak is smaller than the reference peak, the detected peak increases the resistance of the VCR. This may result in the swing amplitude the same as the reference.

In the peak detector cell 120" and a reference generator cell 105, the current density on the transistors may be designed as close as possible. Voltage shifts before the inputs of an error amplifier may be tracked by each other even with a process variation or a temperature variation.

While the invention has been particularly shown and described with reference to the preferred embodiments thereof, it will be understood by those skilled in the art that various changes in form and details may be made without departing from the scope of the invention.

The invention claimed is:

1. An apparatus comprising:
   a first circuit configured to generate an output signal oscillating at a frequency in response to a first control signal and a second control signal, wherein said first circuit comprises a ring oscillator circuit; and
   a second circuit configured to generate said second control signal at an output of an operational amplifier in response to (i) an input voltage received at a control input of said operational amplifier, (ii) a fixed voltage received at a first input of said operational amplifier, (iii) a swing voltage received at a second input of said operational amplifier and (iv) a power supply voltage, wherein said second circuit (i) generates (a) said second control signal and (b) said swing voltage in response to a replica delay cell configured to receive said first control signal, and (ii) adjusts an amplitude of said second control signal in response to said swing voltage.

2. The apparatus according to claim 1, wherein said replica delay cell forms an amplitude control loop.

3. The apparatus according to claim 1, wherein said second circuit comprises said operational amplifier including transconductance (gm) variation.

4. The apparatus according to claim 1, wherein said operational amplifier gain changes according to one of: reducing to compensate for a voltage controlled resistor (VCR) stage gain increment for a low frequency, and increasing to compensate for a voltage controlled resistor (VCR) stage gain decrement for a high frequency.

5. The apparatus according to claim 1, wherein said fixed voltage is generated by a reference voltage generation circuit.

6. The apparatus according to claim 1, wherein (i) for higher oscillation frequencies having high control current, the bandwidth of said operational amplifier is increased by switching more cells to a positive output and (ii) for low oscillation frequencies having a low control current, the bandwidth of said operational amplifier is decreased by switching more cells to a negative output.

7. The apparatus according to claim 1, wherein the bandwidth of the operational amplifier is adjusted by an amount of an output loading capacitance or a compensation capacitance.

8. The apparatus according to claim 1, wherein said input voltage comprises a digital control input signal.

9. An apparatus comprising:
   a first circuit configured to generate an output signal oscillating at a frequency in response to a first control signal and a second control signal; and
   a second circuit configured to generate said second control signal at an output of an operational amplifier in response to (i) an input voltage received at a control input of said operational amplifier, (ii) a fixed voltage received at a first input of said operational amplifier, (iii) a swing voltage received at a second input of said operational amplifier and (iv) a power supply voltage, wherein (A) said second circuit (i) generates (a) said second control signal and (b) said swing voltage in response to a replica delay cell configured to receive said first control signal and (ii) adjusts an amplitude of said second control signal in response to said swing voltage and (B) (i) for higher oscillation frequencies having high control current, the bandwidth of the operational amplifier is increased by switching more cells to a positive output and (ii) for low oscillation frequencies having a low control current, the bandwidth of the operational amplifier is decreased by switching more cells to a negative output.

10. The apparatus according to claim 9, wherein said input voltage comprises a digital control input signal.

11. An apparatus comprising: a first circuit configured to generate an output signal oscillating at a frequency in response to a first control signal and a second control signal; and a second circuit configured to generate said second control signal at an output of an operational amplifier in response to (i) an input voltage received at a control input of said operational amplifier, (ii) a fixed voltage received at a first input of said operational amplifier, (iii) a swing voltage received I0 at a second input of said operational amplifier and (iv) a power supply voltage, wherein (A) said second circuit (i) generates (a) said second control signal and (b) said swing voltage in response to a replica delay cell configured to receive said first control signal and (ii) adjusts an amplitude of said second control signal in response to said swing voltage and (B) the bandwidth of the operational amplifier is adjusted by an amount of an output loading capacitance or a compensation capacitance.

12. The apparatus according to claim 11, wherein said input voltage comprises a digital control input signal.

* * * * *